United States Patent
Jeng et al.

(10) Patent No.: US 9,281,215 B2
(45) Date of Patent: Mar. 8, 2016

(54) MECHANISM FOR FORMING GATE

(71) Applicant: Taiwan Semiconductor Manufacturing Co., Ltd., Hsin-Chu (TW)

(72) Inventors: Jung-Chi Jeng, Tainan (TW); I-Chih Chen, Tainan (TW); Wen-Chang Kuo, Tainan (TW); Ying-Hao Chen, Tainan (TW); Ru-Shang Hsiao, Jhubei (TW); Chih-Mu Huang, Tainan (TW)

(73) Assignee: Taiwan Semiconductor Manufacturing Co., LTD., Hsin-Chu (TW)

( * ) Notice: Subject to any disclaimer, the term of this patent is extended or adjusted under 35 U.S.C. 154(b) by 0 days.

(21) Appl. No.: 14/080,368

(22) Filed: Nov. 14, 2013

(65) Prior Publication Data
US 2015/0129940 A1 May 14, 2015

(51) Int. Cl.
*H01L 27/085* (2006.01)
*H01L 27/088* (2006.01)
*H01L 29/49* (2006.01)
*H01L 21/8238* (2006.01)
*H01L 21/3213* (2006.01)
*H01L 21/28* (2006.01)
*H01L 29/423* (2006.01)
*H01L 29/66* (2006.01)

(52) U.S. Cl.
CPC .... *H01L 21/32135* (2013.01); *H01L 21/28035* (2013.01); *H01L 21/28123* (2013.01); *H01L 27/085* (2013.01); *H01L 27/088* (2013.01); *H01L 29/4238* (2013.01); *H01L 29/49* (2013.01); *H01L 29/4916* (2013.01); *H01L 29/6659* (2013.01); *H01L 21/8238* (2013.01)

(58) Field of Classification Search
CPC ..... H01L 27/085; H01L 27/088; H01L 29/49; H01L 21/8238
See application file for complete search history.

(56) References Cited

U.S. PATENT DOCUMENTS

| | | | |
|---|---|---|---|
| 5,268,319 A | 12/1993 | Harari | |
| 5,440,161 A * | 8/1995 | Iwamatsu et al. | 257/349 |
| 5,652,454 A * | 7/1997 | Iwamatsu et al. | 257/350 |
| 6,465,332 B1 * | 10/2002 | Papadas et al. | 438/480 |
| 2002/0009851 A1 * | 1/2002 | Shukuri et al. | 438/257 |
| 2008/0036013 A1 | 2/2008 | Kotani | |
| 2011/0114996 A1 | 5/2011 | Fiorenza et al. | |
| 2013/0069136 A1 | 3/2013 | Mao et al. | |
| 2014/0242763 A1 | 8/2014 | Chen et al. | |

OTHER PUBLICATIONS

United States Office Action for U.S. Appl. No. 14/080,313 dated Sep. 11, 2014.

* cited by examiner

*Primary Examiner* — Phat X Cao
(74) *Attorney, Agent, or Firm* — Birch, Stewart, Kolasch & Birch, LLP

(57) ABSTRACT

Embodiments of mechanisms for forming a semiconductor device are provided. The semiconductor device includes a semiconductor substrate. The semiconductor device also includes an isolation structure in the semiconductor substrate and surrounding an active region of the semiconductor substrate. The semiconductor device includes a gate over the semiconductor substrate. The gate has an intermediate portion over the active region and two end portions connected to the intermediate portion. Each of the end portions has a first gate length longer than a second gate length of the intermediate portion and is located over the isolation structure.

13 Claims, 10 Drawing Sheets

MECHANISM FOR FORMING GATE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

For a more complete understanding of the embodiments, and the advantages thereof, reference is now made to the following descriptions taken in conjunction with the accompanying drawings.

DETAILED DESCRIPTION OF THE ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1A:
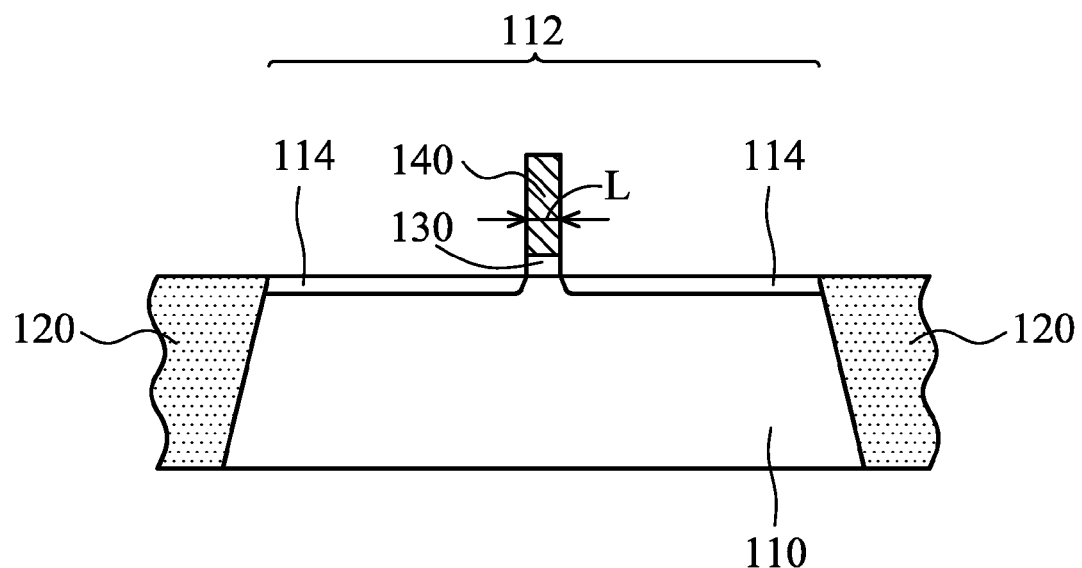
FIGS. 1A-1B are cross-sectional views of various stages of a process for forming a semiconductor device, in accordance with some embodiments.
Figure 1B:
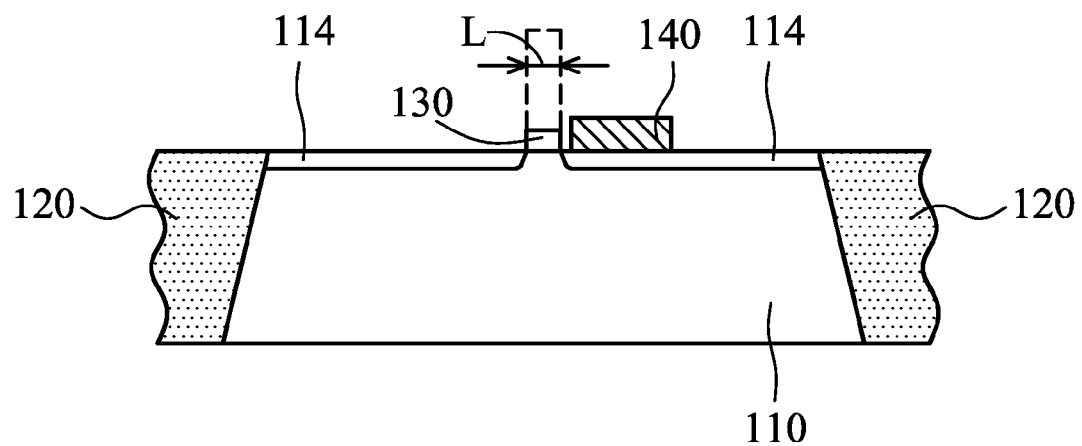

FIGS. 1A-1B are cross-sectional views of various stages of a process for forming a semiconductor device, in accordance with some embodiments. As shown in FIG. 1A, a semiconductor substrate 110 is provided. The semiconductor substrate 110 may be a semiconductor wafer (such as a silicon wafer) or a portion of a semiconductor wafer.

In some embodiments, the semiconductor substrate 110 is made of an elementary semiconductor material including silicon or germanium in a single crystal, polycrystal, or amorphous structure. In some other embodiments, the semiconductor substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The semiconductor substrate 110 may also include multi-layer semiconductors, semiconductor on insulator (SOI) (such as silicon on insulator or germanium on insulator), or combinations thereof.

An isolation structure 120 is formed in the semiconductor substrate 110 to define various active regions 112 of the semiconductor substrate 110, and to electrically isolate neighboring devices (e.g. transistors) from one another. The isolation structure 120 surrounds the active regions 112. The isolation structure 120 may be made of a dielectric material, such as silicon oxide, silicon nitride, silicon oxynitride, fluoride-doped silicate glass (FSG), a low-K dielectric material, other suitable materials, or combinations thereof. The isolation structure 120 may be formed by using an isolation technology, such as local oxidation of semiconductor (LOCOS), shallow trench isolation (STI), or the like.

In some embodiments, the formation of the isolation structure 120 includes patterning the semiconductor substrate 110 by a photolithography process, etching a trench in the semiconductor substrate 110 (for example, by using a dry etching, wet etching, or plasma etching process, or a combination thereof), and filling the trench (for example, by using a chemical vapor deposition process) with the dielectric material. In some embodiments, the filled trench may have a multi-layer structure, such as a thermal oxide liner layer filled with silicon nitride or silicon oxide.

As shown in FIG. 1A, a gate dielectric layer 130 and a gate 140 are formed over the active regions 112 of the semiconductor substrate 110. The gate dielectric layer 130 may be made of silicon oxide, silicon oxynitride, a high dielectric constant material (high-k material), or a combination thereof. The gate 140 may be made of polysilicon or other suitable materials.

Thereafter, lightly doped regions 114 are formed in the semiconductor substrate 110 by using a suitable process, such as an ion implantation process. The ion implantation process may use the gate 140 as a mask, and the lightly doped regions 114 are at two opposite sides of the gate 140. The lightly doped regions 114 may be a lightly doped source region and a lightly doped drain (LDD) region. The dopants used in the ion implantation process may include boron or phosphorous. Afterwards, a cleaning process is performed to clean away the residues formed in the ion implantation process. The cleaning process includes soaking the semiconductor substrate 110 and the gate 140 in a cleaning solution (e.g. an acid solution).

As shown in FIG. 1B, since the gate length L of the gate 140 is very short (e.g. shorter than 100 nm), the gate 140 tends to collapse in the ion implantation process if the ion implantation process is not properly performed. Besides, the gate 140 tends to collapse in the cleaning process due to the surface tension of the cleaning solution. Therefore, it is desirable to find alternative mechanisms for resolving the problem mentioned above.

FIGS. 2A-2I are cross-sectional views of various stages of a process for forming a semiconductor device, in accordance with some embodiments. FIGS. 3A-3F are top views of the structures shown in FIGS. 2A-2E and 2I, respectively. FIGS. 2A-2E and 2I are cross-sectional views of the structures along sectional lines 2A-2A, 2B-2B, 2C-2C, 2D-2D, 2E-2E and 2I-2I shown in FIGS. 3A-3F, respectively.

Figure 2A:
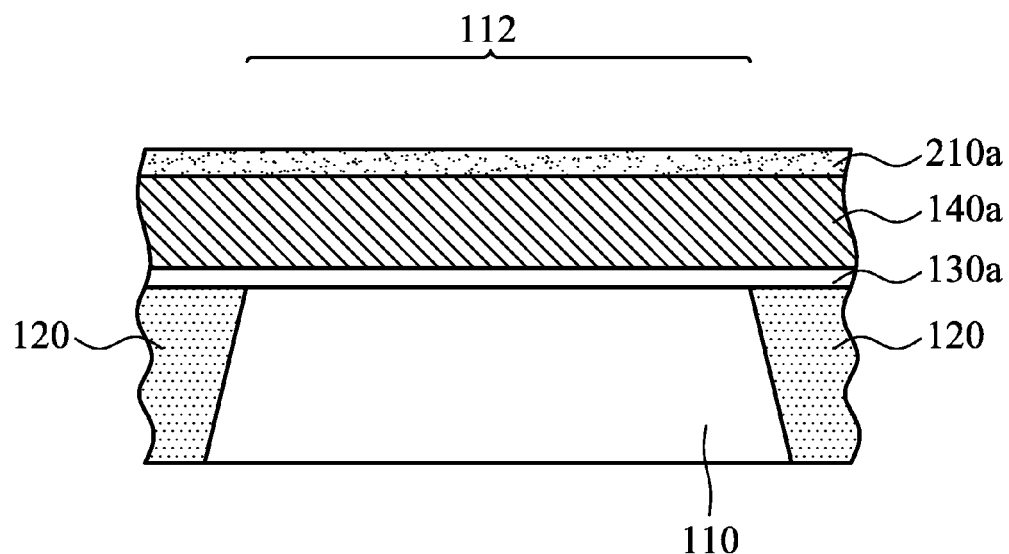
FIGS. 2A-2I are cross-sectional views of various stages of a process for forming a semiconductor device, in accordance with some embodiments.
Figure 3A:
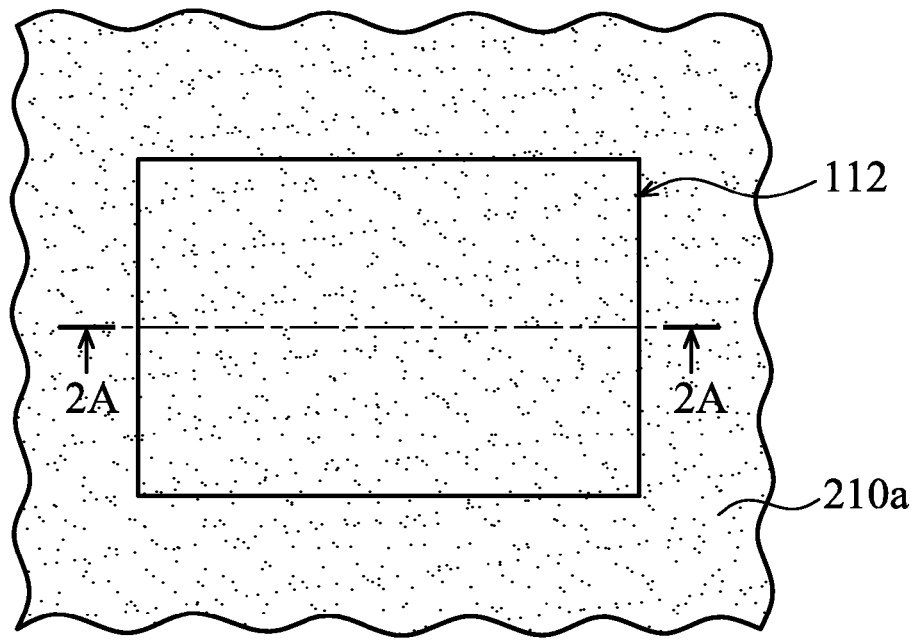
FIGS. 3A-3F are top views of the structures shown in FIGS. 2A-2E and 2I, respectively.

As shown in FIGS. 2A and 3A, a semiconductor substrate 110 is provided. An isolation structure 120 is formed in the semiconductor substrate 110 to define various active regions 112 of the semiconductor substrate 110, and to electrically isolate neighboring devices (e.g. transistors) from one another.

A gate dielectric material layer 130*a* is deposited over the semiconductor substrate 110 by, for example, a chemical vapor deposition process (CVD process). Thereafter, a gate material layer 140*a* is deposited over the gate dielectric material layer 130*a* by, for example, a CVD process. Afterwards, a mask material layer 210*a* may be deposited over the gate material layer 140*a*. The mask material layer 210*a* includes oxides (e.g. silicon oxides) or other suitable materials. The mask material layer 210*a* is deposited by, for example, a CVD process. In some embodiments, the mask material layer 210*a* is optional.

Figure 2B:
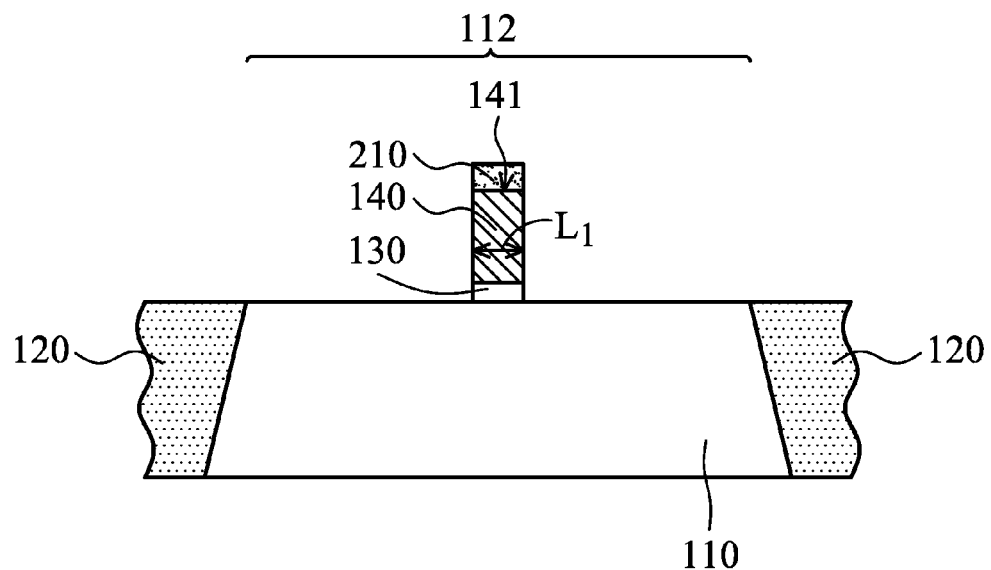
Figure 3B:
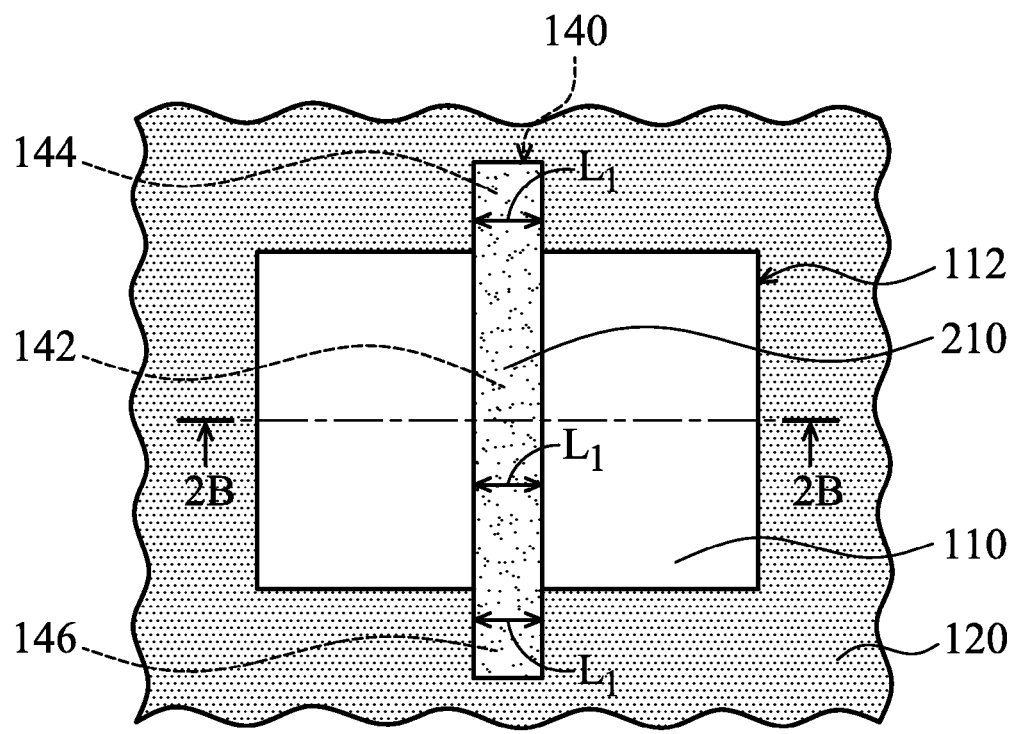

As shown in FIGS. 2B and 3B, a patterning process is performed to pattern the mask material layer 210*a*, the gate material layer 140*a* and the gate dielectric material layer 130*a* so as to form a mask layer (also referred as a top mask layer) 210, a gate 140 and a gate dielectric layer 130. In some embodiments, the mask layer 210 covers the top surface 141 of the gate 140. The gate 140 may extend across the active region 112 onto the isolation structure 120 surrounding the active region 112.

The gate 140 has an intermediate portion 142 over the active region 112 and two opposite end portions 144 and 146 over the isolation structure 120. The intermediate portion 142 is connected between the end portions 144 and 146. In some embodiments, the intermediate portion 142 and the end portions 144 and 146 have substantially the same gate length $L_1$. In some embodiments, the gate length $L_1$ is shorter than or equal to about 100 nm. In some other embodiments, the gate length $L_1$ is longer than about 100 nm.

Figure 2C:
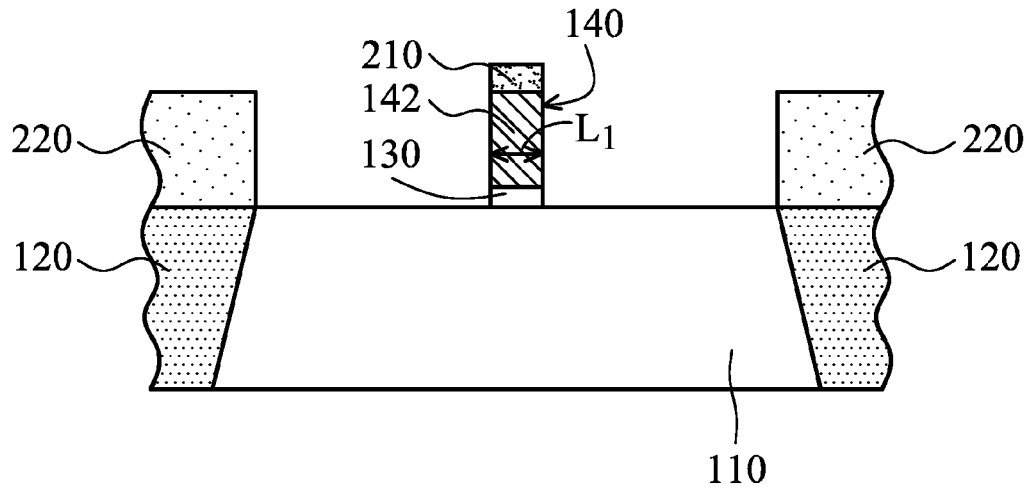
Figure 3C:
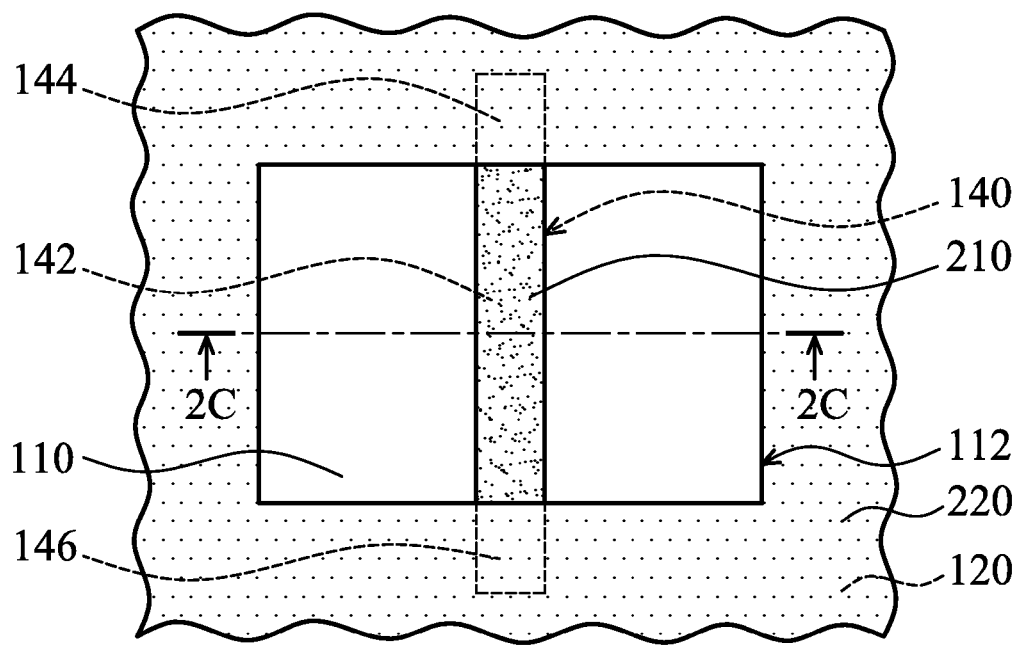

Thereafter, as shown in FIGS. 2C and 3C, a photoresist layer (also referred as an etching mask layer) 220 may be formed over the isolation structure 120 to cover the end portions 144 and 146 of the gate 140. The intermediate portion 142 is exposed by the photoresist layer 220.

Figure 2D:
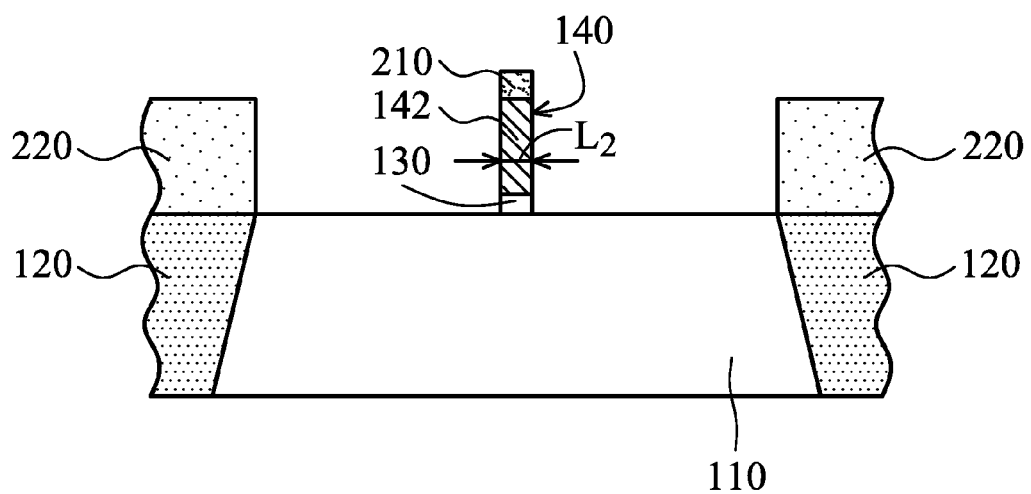
Figure 3D:
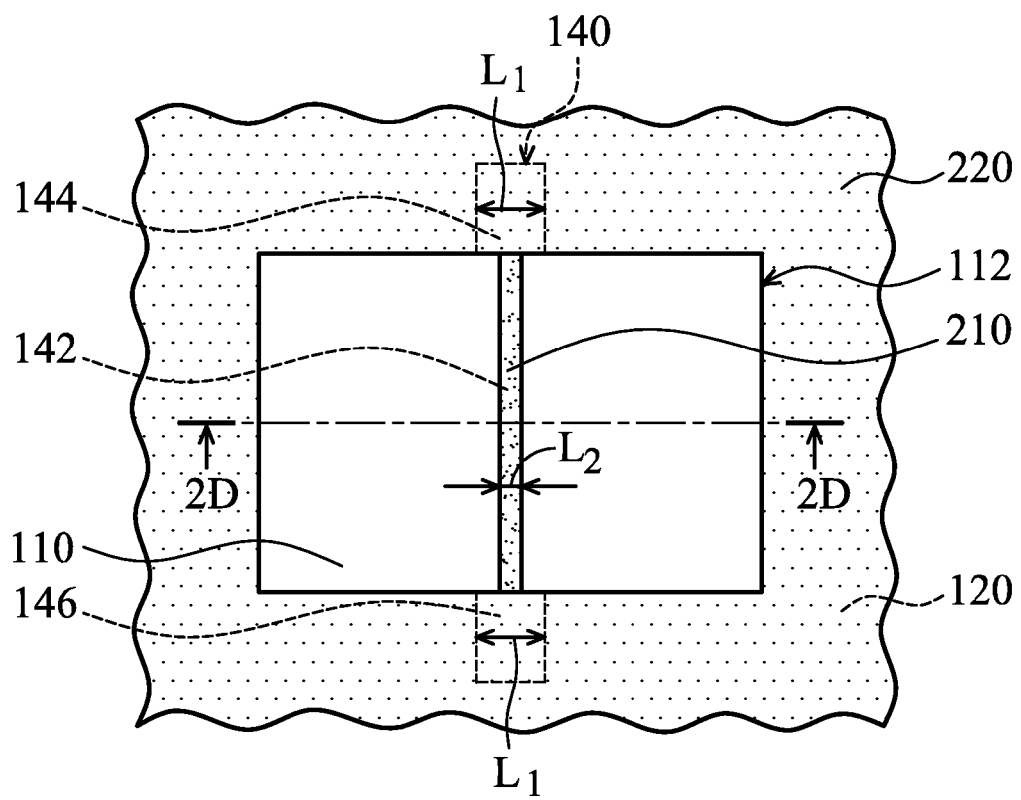

Afterwards, as shown in FIGS. 2D and 3D, an etching process may be performed to decrease the gate length of the intermediate portion 142 exposed by the photoresist layer 220. The etching process may include a dry etching process or a wet etching process. The dry etching process may be a plasma etching process using an etching gas. The etching gas includes, for example, $CF_4$, $Cl_2$, or HBr.

In some embodiments, the etching gas has a high etching selectivity ratio for etching polysilicon (or silicon) with respect to oxides. The etching selectivity ratio is the ratio of the rate of etching the gate 140 (including polysilicon) to the rate of etching the mask layer 210 (including oxides). Therefore, the mask layer 210 is able to protect the top portion of the gate 140 in the etching process to maintain the height of the gate 140.

After the etching process, the intermediate portion 142 has a gate length $L_2$ shorter than the original gate length $L_1$. The gate length $L_1$ of the end portion 144 or 146 is longer than the gate length $L_2$ of the intermediate portion 142. In some embodiments, the gate 140 has an I-shape. In some embodiments, the end portions 144 and 146 have the same gate length $L_1$.

In some embodiments, the gate length $L_2$ of the intermediate portion 142 is shorter than about 100 nm (e.g., shorter than about 60 nm, 50 nm, 40 nm, 30 nm or 20 nm). In some embodiments, the ratio of the gate length $L_2$ of the intermediate portion 142 to the gate length $L_1$ of the end portion 144 or 146 ranges from about 10% to about 95%. The ratio of the gate length $L_2$ of the intermediate portion 142 to the gate length $L_1$ of the end portion 144 or 146 ranges from, for example, about 50% to about 80%.

Since the gate length $L_1$ of the end portion 144 or 146 is longer than the gate length $L_2$ of the intermediate portion 142, the end portions 144 and 146 with the long gate length $L_1$ may prevent the gate 140 from collapsing. Besides, the intermediate portion 142 with the short gate length $L_2$ may provide a short channel length.

Figure 2E:
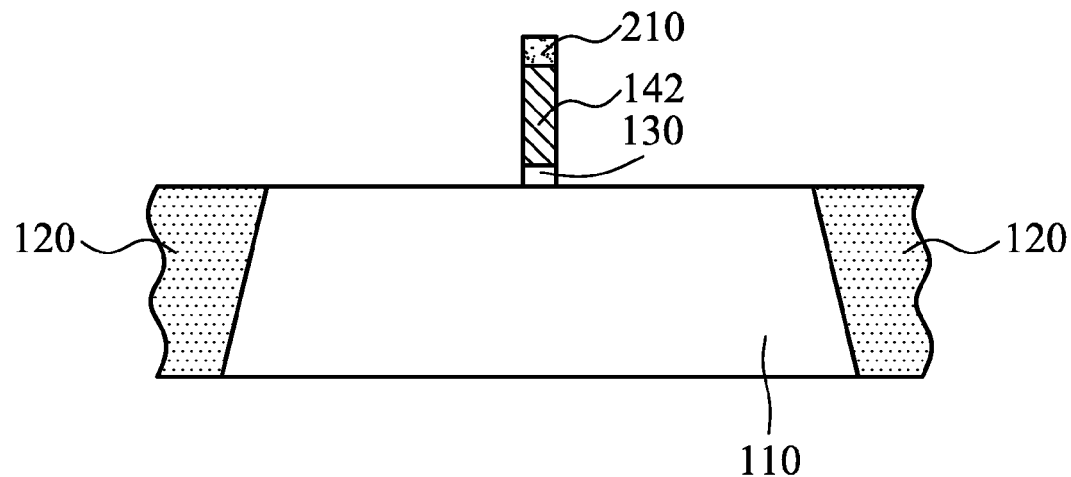
Figure 2F:
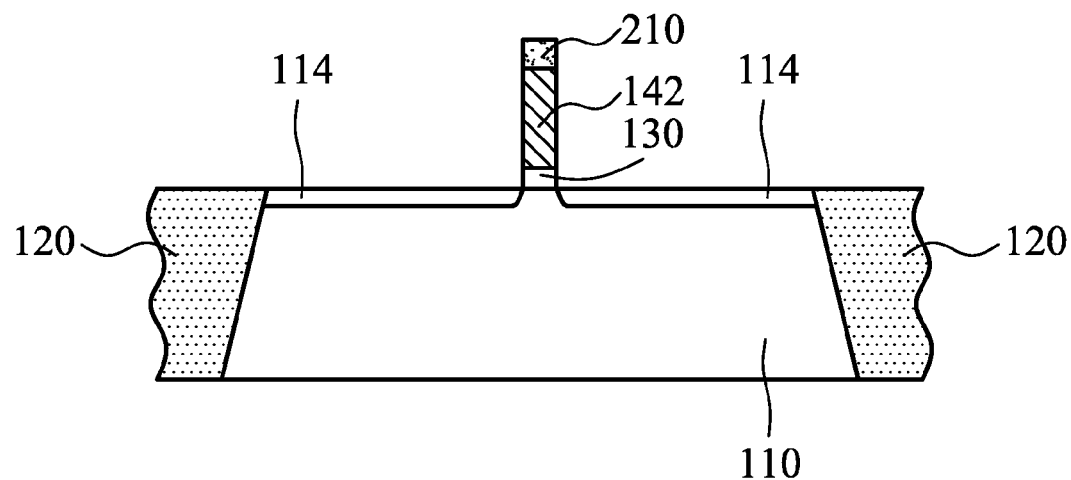
Figure 3E:
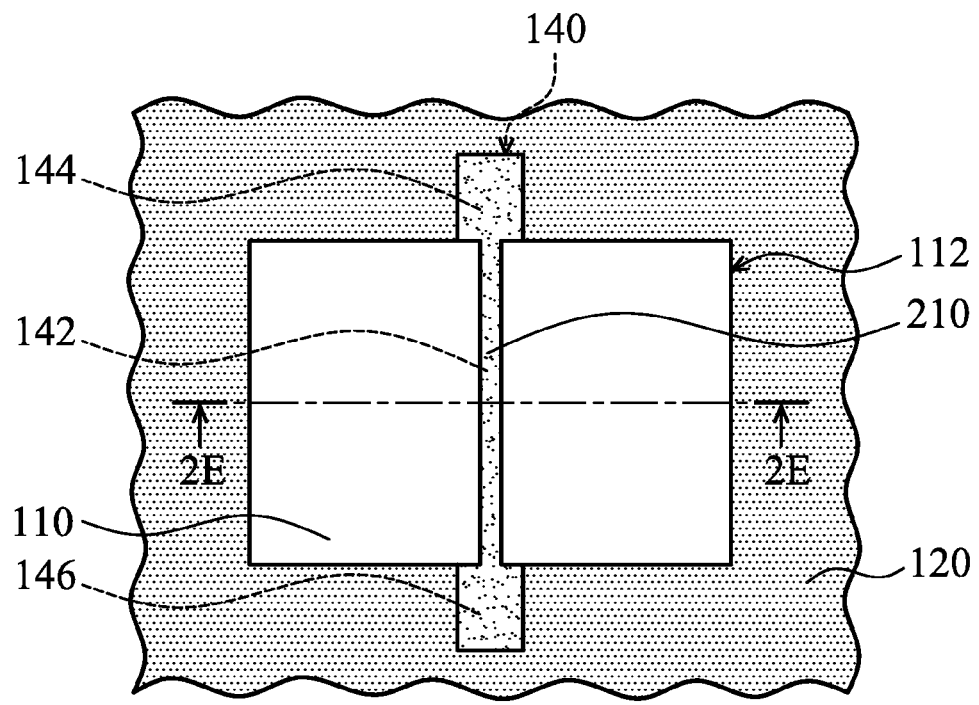

Afterwards, as shown in FIGS. 2E and 3E, the photoresist layer 220 is removed. Thereafter, as shown in FIG. 2F, lightly doped regions 114 are formed in the semiconductor substrate 110 by using a suitable process, such as an ion implantation process. The lightly doped regions 114 may be a lightly doped source region and a lightly doped drain (LDD) region. The lightly doped regions 114 may be located at two opposite sides of the intermediate portion 142.

Figure 2G:
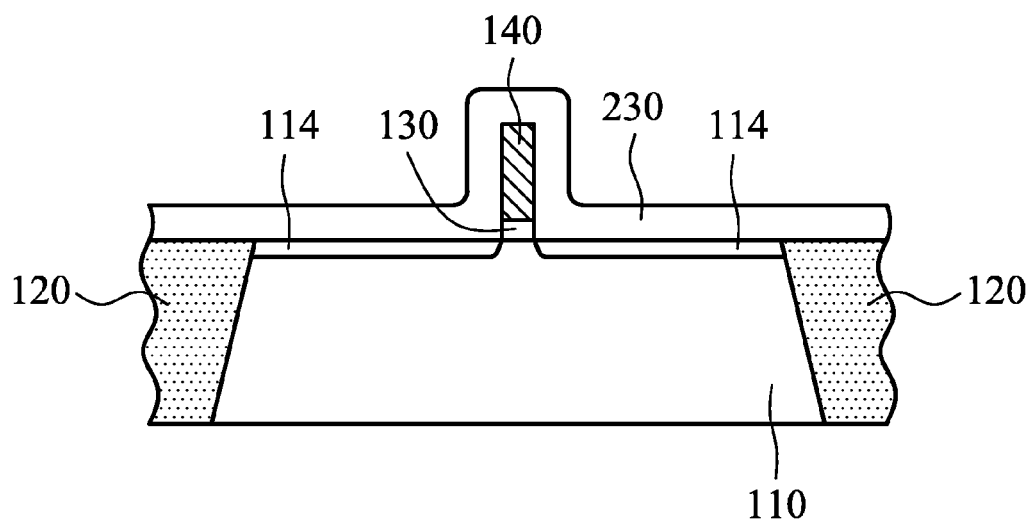

Afterwards, as shown in FIGS. 2G, the mask layer 210 may be removed by using, for example, an etching process. Thereafter, a spacer layer 230 may be deposited on the semiconductor substrate 110 by using, for example, a CVD process. The spacer layer 230 includes insulating materials, such as silicon oxides or silicon nitrides.

Figure 2H:
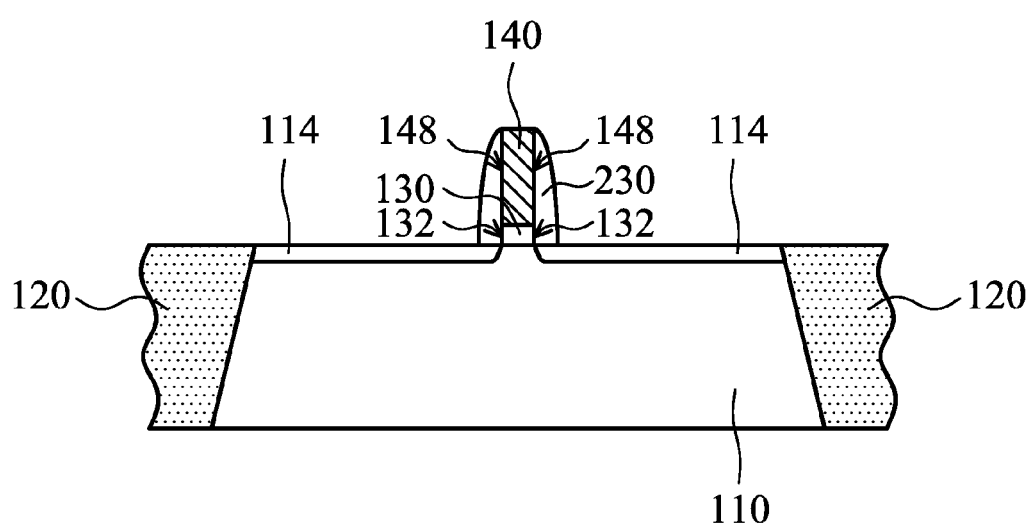

Thereafter, as shown in FIG. 2H, an anisotropic etching process (e.g. a dry etching process) is performed to remove a portion of the spacer layer 230. The remaining spacer layer 230 is over the sidewalls 148 and 132 of the gate 140 and the gate dielectric layer 130. The remaining spacer layer 230 over the sidewalls 148 and 132 may be configured to electrically isolate the gate 140 from other devices and to act as a mask layer in a subsequent ion implantation process.

Figure 2I:
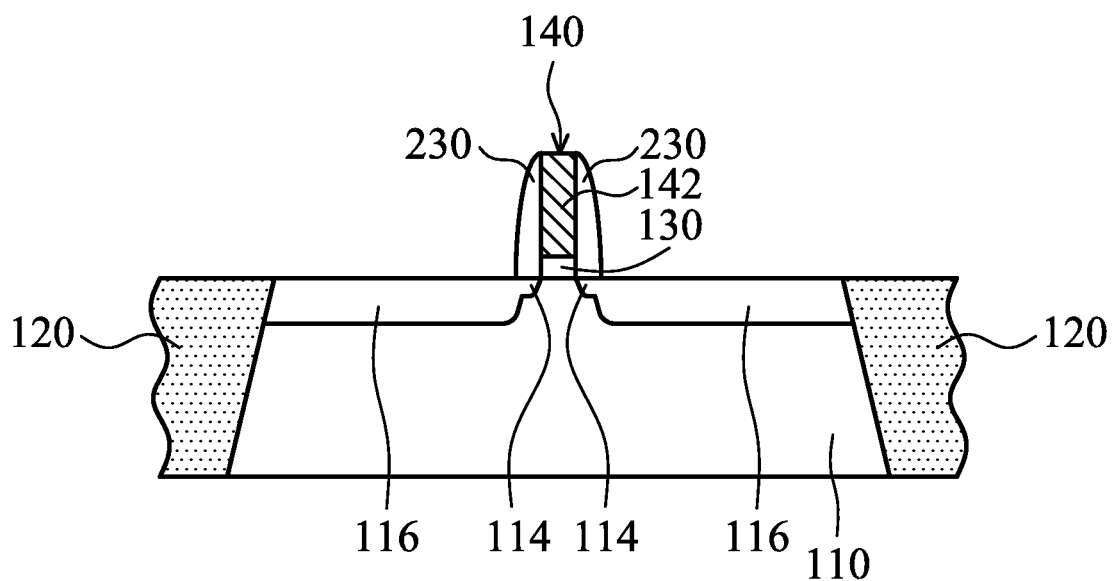
Figure 3F:
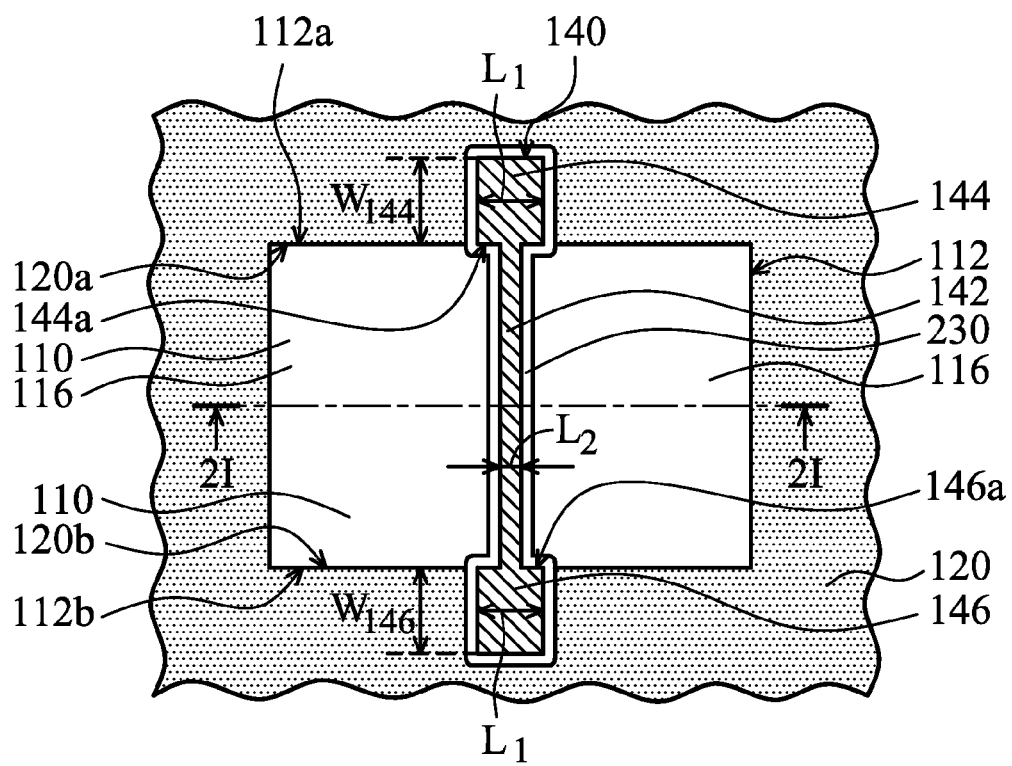

Thereafter, as shown in FIGS. 2I and 3F, heavily doped regions 116 are formed in the semiconductor substrate 110 by using a suitable process, such as an ion implantation process. The heavily doped regions 116 may be a heavily doped source region and a heavily doped drain region. The heavily doped regions 116 may be located at the two opposite sides of the intermediate portion 142. The gate 140, the gate dielectric layer 130, the spacer layer 230, the lightly doped regions 114 and the heavily doped regions 116 may constitute a transistor device.

In some embodiments, the edge 144*a* of the end portion 144 is aligned with the edge 120*a* of the isolation structure 120 or the edge 112*a* of the active region 112. In some embodiments, the edge 146*a* of the end portion 146 is aligned with the edge 120*b* of the isolation structure 120 or the edge 112*b* of the active region 112. In some embodiments, the whole intermediate portion 142 is located over the active region 112, and the whole end portions 144 and 146 are located over the isolation structure 120. In some embodiments, the width $W_{144}$ of the end portion 144 is the same as the width $W_{146}$ of the end portion 146.

Figure 4:
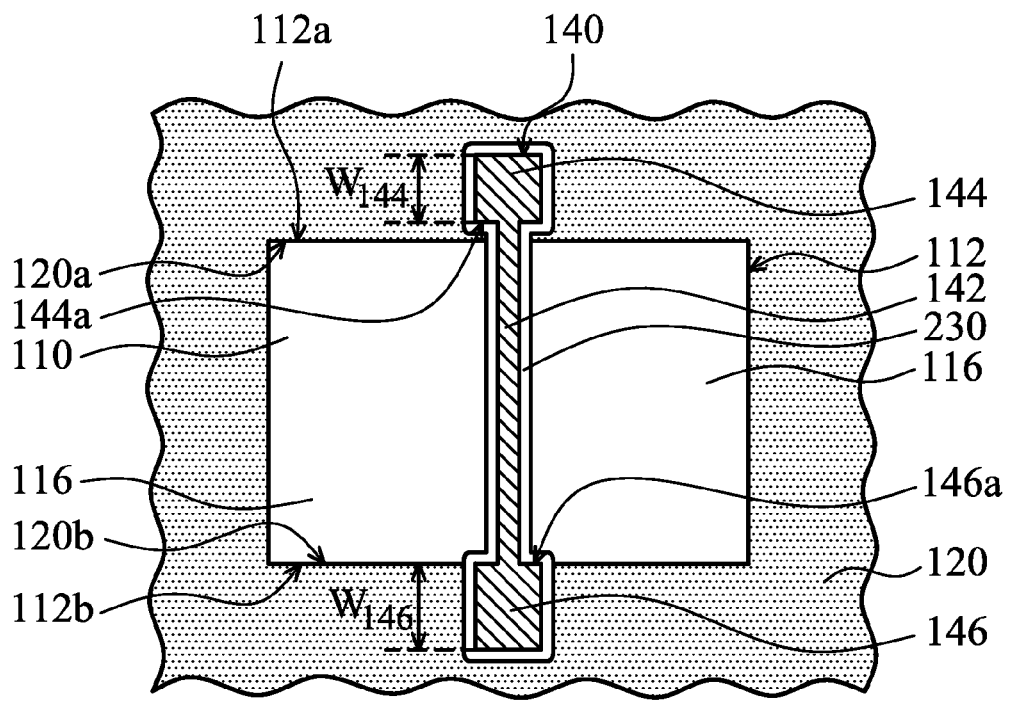
FIG. 4 is a top view of a semiconductor device, in accordance with some embodiments.

In some other embodiments, as shown in FIG. 4, the edge 144a of the end portion 144 is not aligned with the edge 120a of the isolation structure 120. The edge 144a of the end portion 144 is spaced from the edge 112a of the active region 112. The intermediate portion 142 extends onto the isolation structure 120 adjacent to the end portion 144, in accordance with some embodiments. In some embodiments, the width $W_{144}$ of the end portion 144 is different from the width $W_{146}$ of the end portion 146.

Figure 5:
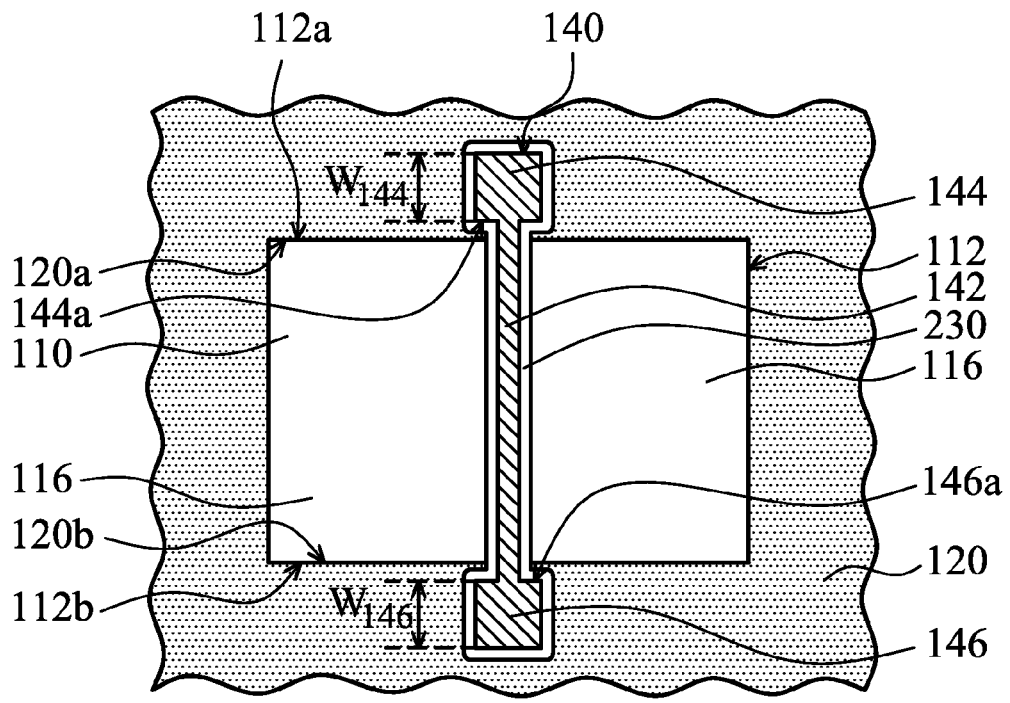
FIG. 5 is a top view of a semiconductor device, in accordance with some embodiments.

In some other embodiments, as shown in FIG. 5, the edges 144a and 146a of the end portions 144 and 146 are not aligned with the edges 120a and 120b of the isolation structure 120, respectively. The edge 144a of the end portion 144 is spaced from the edge 112a of the active region 112, and the edge 146a of the end portion 146 is spaced from the edge 112b of the active region 112. The intermediate portion 142 extends onto the isolation structure 120 adjacent to the end portions 144 and 146, in accordance with some embodiments. The width $W_{144}$ of the end portion 144 is the same as or different from the width $W_{146}$ of the end portion 146.

Embodiments of mechanisms for forming a semiconductor device described above forms a gate having an intermediate portion with a short gate length and two opposite end portions with a long gate length. The intermediate portion is located over the active region, and the end portions are located over the isolation structure. Therefore, the end portions with the long gate length may prevent the gate from collapsing, and the intermediate portion with the short gate length may provide a short channel length.

In accordance with some embodiments, a semiconductor device is provided. The semiconductor device includes a semiconductor substrate. The semiconductor device also includes an isolation structure in the semiconductor substrate and surrounding an active region of the semiconductor substrate. The semiconductor device includes a gate over the semiconductor substrate. The gate has an intermediate portion over the active region and two end portions connected to the intermediate portion. Each of the end portions has a first gate length longer than a second gate length of the intermediate portion and is located over the isolation structure.

In accordance with some embodiments, a semiconductor device is provided. The semiconductor device includes a semiconductor substrate. The semiconductor device also includes an isolation structure in the semiconductor substrate and surrounding an active region of the semiconductor substrate. The semiconductor device includes a gate over the semiconductor substrate. The gate has an intermediate portion over the active region and two end portions connected to the intermediate portion. Each of the end portions has a first gate length longer than a second gate length of the intermediate portion and is located over the isolation structure. The end portions are spaced from the active region.

In accordance with some embodiments, a method for forming a semiconductor device is provided. The method includes providing a semiconductor substrate. The method also includes forming an isolation structure in the semiconductor substrate, and the isolation structure surrounds an active region of the semiconductor substrate. The method includes forming a gate on the semiconductor substrate, and the gate is across the active region and extends onto the isolation structure. The method also includes forming an etching mask layer over the isolation structure to cover end portions of the gate over the isolation structure. An intermediate portion of the gate over the active region is exposed by the etching mask layer. The method includes performing an etching process to decrease a first gate length of the intermediate portion, such that the first gate length of the intermediate portion is shorter than a second gate length of each of the end portions.

Although the embodiments and their advantages have been described in detail, it should be understood that various changes, substitutions, and alterations can be made herein without departing from the spirit and scope of the embodiments as defined by the appended claims Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps.

In addition, each claim constitutes a separate embodiment, and the combination of various claims and embodiments are within the scope of the disclosure.

What is claimed is:

1. A semiconductor device, comprising:
a semiconductor substrate;
an isolation structure in the semiconductor substrate and surrounding an active region of the semiconductor substrate;
a gate over the semiconductor substrate, wherein the gate has an intermediate portion over the active region and two end portions connected to the intermediate portion, the end portions are located over the isolation structure, each of the end portions has a first gate length longer than a second gate length of the intermediate portion, and each of the end portions has a first edge facing the active region and aligned with a second edge of the isolation structure; and
a spacer layer surrounding and covering an entire lateral outer sidewall of the intermediate portion of the gate and an entire lateral outer side wall of the two end portions of the gate, wherein the spacer layer that covers the entire lateral outer side wall of the two end portions of the gate has a first portion located directly above the active region and a second portion located directly above the isolation structure.

2. The semiconductor device as claimed in claim 1, wherein a ratio of the second gate length of the intermediate portion to the first gate length of the end portion ranges from about 10% to about 95%.

3. The semiconductor device as claimed in claim 1, wherein a ratio of the second gate length of the intermediate portion to the first gate length of the end portion ranges from about 50% to about 80%.

4. The semiconductor device as claimed in claim 1, wherein the whole intermediate portion is located over the active region.

5. The semiconductor device as claimed in claim 1, wherein the end portions have the same width.

6. The semiconductor device as claimed in claim 1, wherein the end portions have different widths.

7. The semiconductor device as claimed in claim 1, wherein the second gate length of the intermediate portion is shorter than about 100 nm.

8. The semiconductor device as claimed in claim 1, wherein the gate extends across the active region.

9. A semiconductor device, comprising:
a semiconductor substrate;
an isolation structure in the semiconductor substrate and surrounding an active region of the semiconductor substrate;
a gate over the semiconductor substrate, wherein the gate has an intermediate portion over the active region and two end portions connected to the intermediate portion, the end portions are located over the isolation structure, each of the end portions has a first gate length longer than a second gate length of the intermediate portion, the active region is between the end portions, and each of the end portions has a first edge facing the active region and aligned with a second edge of the isolation structure; and
a spacer layer surrounding and covering an entire lateral outer sidewall of the intermediate portion of the gate and an entire lateral outer side wall of the two end portions of the gate, wherein the spacer layer that covers the entire lateral outer side wall of the two end portions of the gate has a first portion located directly above the active region and a second portion located directly above the isolation structure.

10. The semiconductor device as claimed in claim 9, wherein the end portions have the same width.

11. The semiconductor device as claimed in claim 9, wherein a ratio of the second gate length of the intermediate portion to the first gate length of the end portion ranges from about 50% to about 80%.

12. The semiconductor device as claimed in claim 9, wherein the gate extends across the active region.

13. The semiconductor device as claimed in claim 9, wherein the whole intermediate portion is located over the active region.

* * * * *